United States Patent
Jang et al.

(10) Patent No.: US 9,490,744 B2
(45) Date of Patent: Nov. 8, 2016

(54) OSCILLATOR REGULATION CIRCUITRY AND METHOD

(71) Applicant: THE REGENTS OF THE UNIVERSITY OF MICHIGAN, Ann Arbor, MI (US)

(72) Inventors: Taekwang Jang, Ann Arbor, MI (US); Dennis Michael Sylvester, Ann Arbor, MI (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/560,788

(22) Filed: Dec. 4, 2014

(65) Prior Publication Data

US 2016/0164460 A1    Jun. 9, 2016

(51) Int. Cl.
| | | |
|---|---|---|
| *H03L 7/00* | (2006.01) | |
| *H03B 5/12* | (2006.01) | |
| *H03L 7/099* | (2006.01) | |
| *H03L 1/00* | (2006.01) | |
| *H03L 7/18* | (2006.01) | |
| *H03L 7/187* | (2006.01) | |
| *H03L 7/193* | (2006.01) | |

(52) U.S. Cl.
CPC .......... *H03B 5/1265* (2013.01); *H03B 5/1271* (2013.01); *H03L 1/00* (2013.01); *H03L 7/00* (2013.01); *H03L 7/099* (2013.01); *H03L 7/18* (2013.01); *H03L 7/187* (2013.01); *H03L 7/193* (2013.01)

(58) Field of Classification Search
CPC ....... H03B 5/10; H03L 7/099; H03L 7/0992; H03L 7/18; H03L 7/193; H03L 7/187
USPC ............. 331/34, 177 R, 175, 16, 1 A, 177 V
See application file for complete search history.

(56) References Cited

U.S. PATENT DOCUMENTS

2002/0041217 A1* 4/2002 Crofts ................. H03K 3/0231
                                                          331/175

OTHER PUBLICATIONS

Alon, E.; et al., "Replica Compensated Linear Regulators for Supply-Regulated Phase-Locked Loops," IEEE Journal of Solid-State Circuits, vol. 41, No. 2, Feb. 2006, 12 pages.

Arakali, A.; et al., "Analysis and Design Techniques for Supply-Noise Mitigation in Phase-Locked Loops", IEEE Transactions on Circuits and Systems—I: Regular Papers, vol. 57, No. 11, Nov. 2010, 10 pages.

(Continued)

*Primary Examiner* — Arnold Kinkead
(74) *Attorney, Agent, or Firm* — Pramudji Law Group PLLC; Ari Pramudji

(57) ABSTRACT

Oscillator regulation circuitry is provided for regulating a frequency of an output signal generated by an oscillator. Oscillator regulation circuitry has frequency sensing circuitry for sensing the frequency of the output signal and generating a first signal depending on the frequency, and control circuitry which generates the oscillator control signal based on the comparison between the first signal and a non-oscillating reference signal. The frequency sensing circuitry includes at least one switched capacitor. This approach provides improved noise reduction, less sensitivity to process, temperature and voltage variations, and a more linear scaling of the frequency with the reference signal, compared to previous techniques.

16 Claims, 4 Drawing Sheets

(56) References Cited

OTHER PUBLICATIONS

Kodama, H. et al, "Wide Lock-Range, Low Phase-Noise PLL using Interpolative Ring-VCO with Coarse Frequency Tuning and Frequency Linearization," IEEE 2007 Custom Integrated Circuits Conference (CICC), Sep. 16-19, 2007, 4 pages.

Cowan, G.E.R.; et al., "A Linearized Voltage-Controlled Oscillator for Dual-Path Phase-Locked Loops," Circuits and Systems (ISCAS), 2013 IEEE International Symposium on, May 19-23, 2013, 4 pages.

Chiang Y-C, et al., "A Back-Gate Coupling QVCO With Kvco Linearization Technique," 2009 IEEE International Symposium on Radio-Frequency Integration Technology, Jan. 9, 2009-Dec. 11, 2009, 3 pages.

* cited by examiner

OSCILLATOR REGULATION CIRCUITRY AND METHOD

BACKGROUND

1. Technical Field

The present technique relates to a technique for regulating a frequency of an output signal generated by an oscillator.

2. Technical Background

A data processing device (e.g. an integrated circuit) may use an oscillator, or a frequency synthesizer which includes an oscillator, to generate an output signal at a given frequency. For example the output signal may be used as a clock signal for other elements of the device, such as a processor. However, if there is noise in the supply voltage powering the oscillator, or the temperature changes, then this may cause variation in the frequency of the output signal, which may be undesirable. Hence, it is desirable to provide a technique for regulating the frequency of an output signal generated by the oscillator.

SUMMARY

Viewed from one aspect, the present technique provides oscillator regulation circuitry comprising:

control circuitry to generate an oscillator control signal for regulating a frequency of an output signal of an oscillator;

wherein the control circuitry comprises frequency sensing circuitry to sense the frequency of the output signal of the oscillator and to generate a first signal dependent on the frequency of the output signal, wherein the frequency sensing circuitry comprises at least one switched capacitor; and the control circuitry is to generate the oscillator control signal in dependence on a comparison between the first signal and a non-oscillating reference signal.

Viewed from another aspect, the present technique provides an apparatus comprising the oscillator regulation circuitry and an oscillator.

Viewed from another aspect, the present technique provides oscillator regulation circuitry comprising:

control means for generating an oscillator control signal for regulating a frequency of an output signal of an oscillator;

wherein the control means comprises frequency sensing means for sensing the frequency of the output signal of the oscillator and for generating a first signal dependent on the frequency of the output signal, wherein the frequency sensing means comprises at least one switched capacitor; and the control means is for generating the oscillator control signal in dependence on a comparison between the first signal and a non-oscillating reference signal.

Viewed from a further aspect, the present technique provides a method for regulating a frequency of an output signal generated by an oscillator;

the method comprising:

sensing the frequency of the output signal of the oscillator;

generating a first signal dependent on the frequency of the output signal using at least one switched capacitor;

comparing the first signal and a non-oscillating reference signal; and generating the oscillator control signal in dependence on a comparison between the first signal and the non-oscillating reference signal.

Further aspects, features and advantages of the present technique will be apparent from the following description of examples, which is to be read in conjunction with the accompanying drawings.

DESCRIPTION OF EXAMPLES

Figure 1:
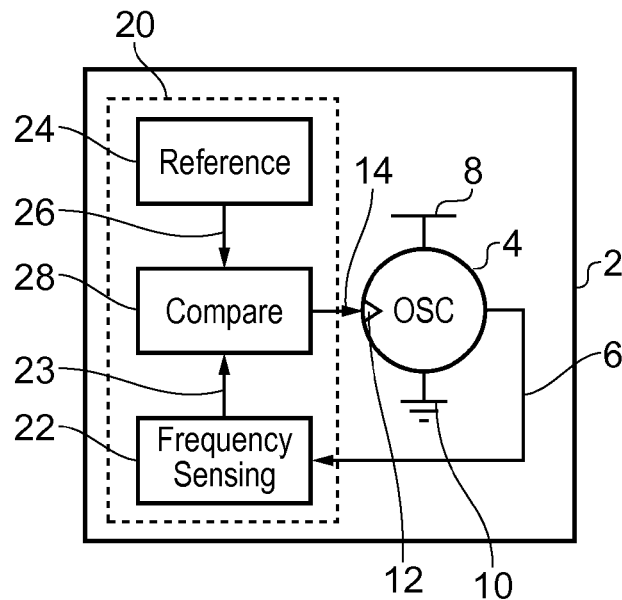
FIG. 1 illustrates an example of an apparatus having an oscillator for generating an output signal and oscillator regulation circuitry for regulating a frequency of the output signal.

One technique for regulating the oscillator output frequency is to provide a voltage regulator between the voltage supply and the supply input of the oscillator, to stabilize the supply voltage supplied to the oscillator. However, the inventors realised that in this case both the voltage regulator and the oscillator contribute to noise in the output signal, and also this technique makes it difficult to achieve linearization of the frequency of the output signal (that is, the frequency generated by the oscillator may not scale linearly with an input signal provided to the voltage regulator, so that it is harder to control the oscillator to generate a given frequency).

Instead, oscillator regulation circuitry may be provided for regulating the frequency of the output signal generated by the oscillator by controlling an oscillator control signal supplied to a control input of the oscillator, rather than attempting to stabilise the supply voltage. For example, the oscillator may be a voltage controlled oscillator (VCO) or current controlled oscillator (ICO) and the oscillator control signal may be a voltage or current which is input to the oscillator to control the oscillator frequency.

According to one example, oscillator regulation circuitry may have control circuitry which generates the oscillator control signal for regulating the frequency of an output signal of an oscillator. The control circuitry may have frequency sensing circuitry for sensing the frequency of the output signal and generating a first signal dependent on the frequency of the output signal, and the control circuitry may then generate the oscillator control signal based on a comparison between the first signal and a non-oscillating reference signal. The frequency sensing circuitry may include at least one switched capacitor. In this way, the control circuitry may effectively act as a feedback loop which senses the frequency generated by the oscillator and adjusts the oscillator control signal to counteract changes or deviations from a desired frequency, with at least one switched capacitor providing the frequency sensing capability. This has several advantages over previous techniques, providing greater noise filtering, allowing for linear tuning of the frequency based on the reference signal, and providing increased robustness to process, voltage or temperature variations.

While the oscillator regulation circuitry may protect against any variation in the frequency generated by the oscillator (e.g. due to temperature effects or process variation), it is particularly useful in guarding against variation in the frequency caused by noise in the supply voltage. The control circuitry may generate the oscillator control signal to counteract changes in the frequency caused by variation in the supply voltage. Since there is a feedback loop which adjusts the oscillator control signal input to the oscillator based on the frequency sensed from the output signal, it is not necessary to provide a regulator between the supply input of the oscillator and the voltage supply.

In some cases the first signal generated by the frequency sensing circuitry may have a voltage which depends on the frequency of the output signal, and the non-oscillating reference signal may comprise a reference voltage to be compared against the first signal. For example, the control circuitry may include a comparator circuit for comparing these voltages.

In other examples, the first signal may have a current which depends on the frequency of the output signal and the non-oscillating reference signal may comprise a reference current. In this case, it is the relative magnitudes of the current of the first signal and the reference current which determines the oscillator control signal. In this case, it may not be necessary to provide a specific comparison circuit. For example, by coupling the first signal and the non-oscillating reference signal to a particular signal node of the control circuit on which the oscillator control signal depends (this node is referred to as a "first node"), the current of the first signal and the reference current may compete to pull the first node towards opposite signal levels, so that the signal level of the first node (and hence the oscillator control signal) will depend on which current is larger. For example, if the oscillator frequency drops, then the frequency sensing circuit may generate a smaller current as the first signal, so that the reference current outcompetes the first signal and pulls the first node to a value which causes the oscillator control signal to control the oscillator to increase the frequency again. Conversely, if the frequency temporarily increases then the frequency sensing circuitry may generate a larger current as the first signal, which may then begin to outcompete the reference signal so that the first node is pulled towards the opposite signal level, so that the oscillator reduces the frequency. In general, the equilibrium point (the frequency at which the oscillator settles) occurs when the current of the first signal equals the reference current, and so the effective frequency at which the oscillator is regulated will depend on the reference current. Hence, this allows for regulation of the oscillator frequency with linear scaling of the frequency, using a control circuit with relatively few components which is relatively power and area efficient.

Reference signal providing circuitry may be provided to generate the reference signal. In some cases the reference signal providing circuitry may comprise a current source which generates a particular amount of current as the reference signal. In other cases the reference signal providing circuitry may generate the reference signal in dependence on an input voltage which is supplied to it. For example the reference signal providing circuitry may comprise a voltage regulator to generate a given voltage in response to the supplied input voltage, and the output of the voltage regulator may be applied to the gate of a transistor supplying the reference signal, so that the magnitude of the reference current passed by the transistor depends on the output of the voltage regulator, which depends on the input voltage. Hence, there are several ways in which the reference signal may be provided. The reference signal is a non-oscillating signal. In other words, the reference signal may have a steady state level, rather than a level which oscillates between two values.

As mentioned above, the frequency sensing circuitry may include at least one switched capacitor. By alternately charging and discharging the capacitor using signals derived from the output signal of the oscillator, the conductance of the capacitor may be (linearly) proportional to the frequency of the output signal. This means that the current flowing through the capacitor is proportional to the output frequency, and so the current from the capacitor can be used as the first signal as a measure of the frequency. This provides a relatively simple circuit for sensing the frequency of the oscillator output.

For example, one or more switches may be provided to control the charging/discharging of the switched capacitors. For example, non-overlapping clock generating circuitry may be provided to generate first and second non-overlapping clock signals based on the output signal of the oscillator. The non-overlapping clock signals may be out of phase with each other and may be generated so that only one of the non-overlapping clock signals is high at any given time. Any known non-overlapping clock generator may be used for this. Switch circuitry may then control the at least one switched capacitor to be charged in response to the first non-overlapping clock signal and to be discharged in response to the second non-overlapping clock signal, so that the switched capacitor is alternately charged and discharged repeatedly at a rate depending on the frequency generated by the oscillator.

A voltage regulator may be provided to regulate an input voltage for charging the at least one switched capacitor. For example, the regulator may be an operational amplifier. The input voltage affects the proportionality between the reference signal and the oscillator frequency, so by adjusting a control input to the regulator, the way in which the oscillator regulation responds to a given reference signal level can be adjusted.

Similarly, the capacitance of the at least one switched capacitor also affects the proportionality between the reference signal and the oscillator frequency. Hence, different numbers of capacitors, or capacitors with different capacitances, may be provided in different implementations to provide a desired proportional relationship between the reference signal and the oscillator frequency at the equilibrium point of the feedback loop.

In some cases the oscillator regulation circuitry may be provided separately from the oscillator itself, as a standalone device. For example, the oscillator regulation circuitry could be provided on a separate chip to the oscillator.

However, often the oscillator and oscillator regulating circuitry may be provided within the same apparatus. As mentioned above, the oscillator may be either a VCO or ICO. Any known voltage/current controlled oscillator design can be used for the oscillator. One advantage of the present technique is that, since the supply voltage does not need to be regulated since oscillator regulation is carried out instead via the oscillator control signal, the supply input of the oscillator can be coupled directly to the voltage supply. This is very useful for devices which run off a relatively low supply voltage (e.g. for wireless sensor nodes or Internet of Things devices with relatively small batteries or running off ambient harvested energy). By directly coupling the oscillator to the voltage supply, the entire rail-to-rail voltage may be generated at the output of the oscillator, so that the technique is friendly to low supply voltages. In contrast if a regulator was coupled between the voltage supply and the oscillator then this would be reduce the effective supply voltage seen by the oscillator, thus reducing the voltage swing in the output signal of the oscillator.

FIG. 1 shows an example of an apparatus 2 having an oscillator 4 for generating an output signal 6 at a given frequency. The oscillator is coupled between a voltage supply rail 8 (VDD) and a ground supply 10, which provide a voltage difference across the oscillator 4 to power the oscillator. The oscillator 4 also has a control input 12 for receiving an oscillator control signal 14. The oscillator 4 generates the output signal 6 with a frequency depending on the oscillator control signal 14. For example the oscillator 4 may be a voltage controlled oscillator (VCO) or a current controlled oscillator (ICO) according to any known VCO or ICO design.

The oscillator output frequency may vary over time. For example, there may be noise in the supply voltage provided by rail 8, or noise generated by transistors within the apparatus 2, or transistor characteristics may change due to again, or the operating temperature of the apparatus 2 may change, or there may be other changes to the environment of the apparatus 2. Also, process variation may mean that two otherwise identical apparatuses 2 could generate different frequencies, e.g. due to different conditions arising during the manufacture of the apparatuses 2 which can cause some transistors to switch more quickly than others, causing the oscillator to generate a higher or lower frequency than expected. Hence, there may be a number of reasons why the oscillator frequency may not be at the desired level. This can cause problems if the oscillator output signal is used to clock other elements of the apparatus 2 (e.g. a processor or memory), which may require a certain clock frequency to function correctly.

To protect against this, oscillator regulation circuitry 20 is provided to regulate the frequency of the oscillator 4. The oscillator control signal 14 is generated by oscillator regulation circuitry 20 based on the output signal 6 of the oscillator 4. The regulation circuitry 20 provides a feedback loop which senses deviations of the frequency of the output signal from a preferred frequency, and changes the oscillator control signal to counteract such deviations. As shown in FIG. 1, the regulation circuitry has frequency sensing circuitry 22 for sensing a frequency of the output signal 6 and generating a first signal 23 depending on the frequency, reference signal providing circuitry 24 for providing a reference signal 26 representing the preferred frequency to be generated, and a comparison circuit 28 for comparing the first signal 23 with the reference signal 26, to generate the oscillator control signal 14. In some cases, the comparison circuit 28 may compare voltages of the first signal 23 and the reference signal 26. In other examples, the comparison circuit 28 may compare currents.

Figure 2:
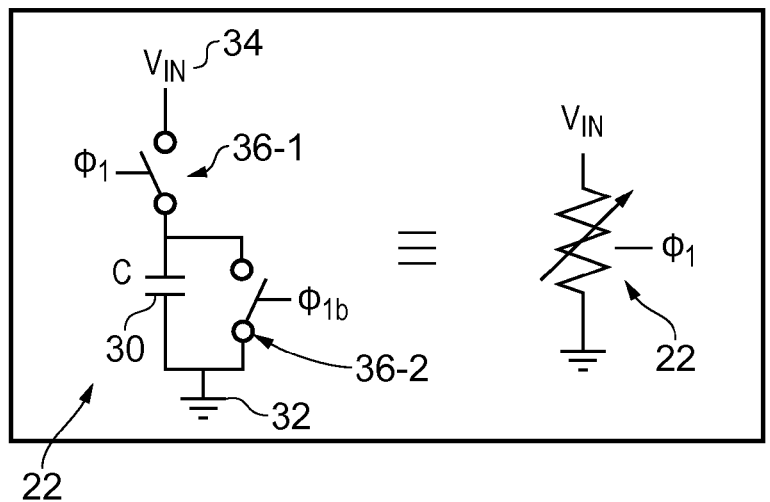
FIG. 2 shows an example of frequency sensing circuitry.
Figure 2:
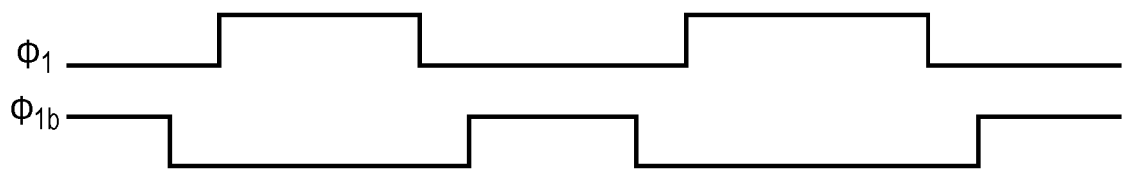

FIG. 2 shows an example of the frequency sensing circuitry 22. As shown in the left hand part of FIG. 2 the frequency sensing circuitry 22 has a switched capacitor 30 which is coupled between a ground supply 32 and an input voltage 34 ($V_{IN}$), and a number of switches 36 for controlling the switched capacitor 30 to be alternately charged and discharged at a rate depending on the frequency of the output signal 6 generated by the oscillator 4.

As shown in the lower part of FIG. 2, first and second non-overlapping clock signals $\phi_1$, $\phi_{1b}$ may be generated based on the output signal 6, so that they have a frequency depending on the frequency of the output signal 6, but are non-overlapping in the sense that only one of the signals $\phi_1$, $\phi_{1b}$ is high at any given time and the signals are not in phase with each other. One of the non-overlapping clock signals $\phi_1$ is used to control a first switch 36-1 which when closed causes the capacitor 30 to be charged to the input voltage $V_{IN}$. The other of the non-overlapping clock signals $\phi_{1b}$ controls a second switch 36-2 which when closed controls the capacitor 30 to be discharged to ground. Hence, the switches 36 together control the capacitor to be alternately charged and discharged repeatedly at a rate which depends on the frequency of the output signal of the oscillator. The net result is that the average current flowing through the capacitor 30 is around $C \times V_{IN} \times F_{OSC}$, where C is the capacitance of the capacitor 30, $V_{IN}$ is the input voltage applied to the capacitor and $F_{OSC}$ is the frequency generated by the oscillator. The conductance of the capacitor is $C \times F_{OSC}$, which is proportional to the frequency of the output signal. While FIG. 2 shows an example with a single switched capacitor 30, in other examples multiple capacitors could be charged/discharged in parallel to provide added capacitance, so as to change the proportionality constant $C \times V_{IN}$ between the frequency $F_{OSC}$ and the current generated as the first signal. Also, as shown below, the input voltage $V_{IN}$ can also be varied to change the proportionality.

Hence, the current flowing from the capacitor 30 may be used as the first signal 23 which is proportional to the frequency generated by the oscillator 4. As shown in the right hand part of FIG. 2, the switched capacitor 30 essentially functions as a variable resistor with a resistance (conductance) depending on the frequency of the output signal 6. The subsequent drawings show the frequency sensing circuit 22 represented in short hand using the variable resistor representation as in the right hand part of FIG. 2, but it will be appreciated that this is equivalent to the switched capacitor arrangement shown in the left hand part of FIG. 2.

Figure 3:
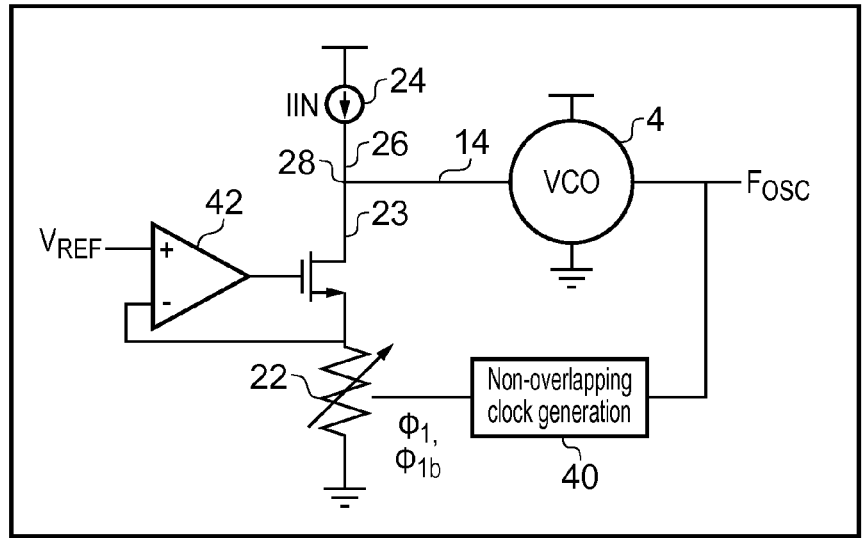
FIG. 3 shows an example showing the oscillator regulation circuitry in more detail.

FIG. 3 shows the feedback loop provided by the regulation circuitry 20 in more detail. In this example the oscillator 4 is a voltage controlled oscillator, but it will be appreciated that a current controlled oscillator could also be used. As shown in FIG. 3 a non-overlapping clock generator 40 is provided to generate the non-overlapping clock signals $\phi_1$, $\phi_{1b}$ for controlling the switching of the capacitor as in FIG. 2. In FIG. 3, an operational amplifier 42 is provided to regulate the input voltage $V_{IN}$ for the switched capacitor to near $V_{REF}$ ($V_{REF}$ is a control voltage supplied to the operational amplifier 42). It will be appreciated that other types of voltage regulators could also be used. This means that the current flowing through the switched capacitor is around $C \times V_{REF} \times F_{OSC}$. The reference signal providing circuit 24 in this example is a current source which provides a given amount of input current IIN.

The comparison circuit in this example is simply a node 28 ("first node") of the feedback loop which is coupled to receive both the first signal 23 generated by the frequency sensing circuitry 22 and the reference current 26 supplied from the current source 24. The oscillator control signal 14 is dependent on the signal level at the first node. The first signal 23 acts to pull the first node 28 down towards ground, while the reference current 26 acts to pull the first node 28 up towards the supply voltage. Hence, the first signal and reference current compete to pull the first node 28 in opposite directions. The signal level at the first node 28 will therefore depend on the relative magnitudes of the currents supplied by the frequency sensing circuit 22 and current source 24—the greater the current through the switched capacitor, the more the first node 28 is pulled down to ground. Hence, if the frequency of the oscillator increases so as to increase the current through the capacitor 22 then this will cause the node 28 to be pulled towards a lower voltage, so that the VCO 4 reduces the frequency. If the frequency of the oscillator decreases for any reason, then the amount of current through the switched capacitor in the frequency sensing circuit 22 may fall, and now the reference current outcompetes the current provided by the first signal 23, so that the oscillator control signal 14 is pulled up towards the supply voltage, which may then cause the VCO 4 to decrease the frequency. The feedback loop is stabilised when the input current IIN is equal to the current flowing through the switch capacitor, i.e. $IIN=C \times V_{REF} \times F_{OSC}$. Therefore, the frequency generated by the oscillator 4 will tend towards $F_{OSC}=IIN/CV_{REF}$, so there is a linear relationship between the reference current and the frequency generated by the oscillator. This is not possible with previous techniques for stabilising the oscillator frequency.

Figure 4:
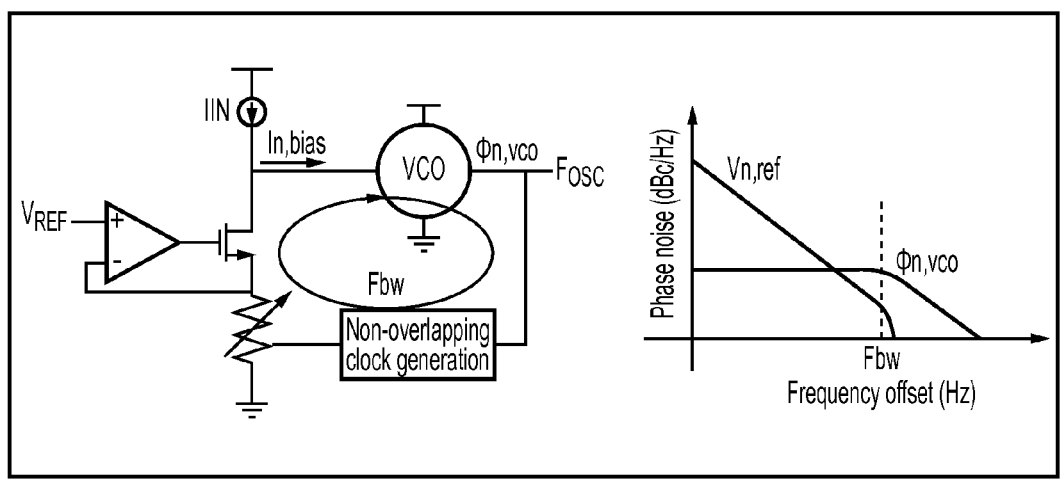
FIG. 4 illustrates factors contributing to noise at the output of the oscillator.

This regulation loop has several advantages:

1. Noise filtering: The two main noise sources of the regulation loop, the bias and the oscillator, are shown in FIG. 4. The noise from the bias is low pass filtered while the noise from the VCO is high pass filtered. By setting the loop bandwidth larger than 100 MHz, the output phase noise is dominated by the bias noise.

Figure 5:
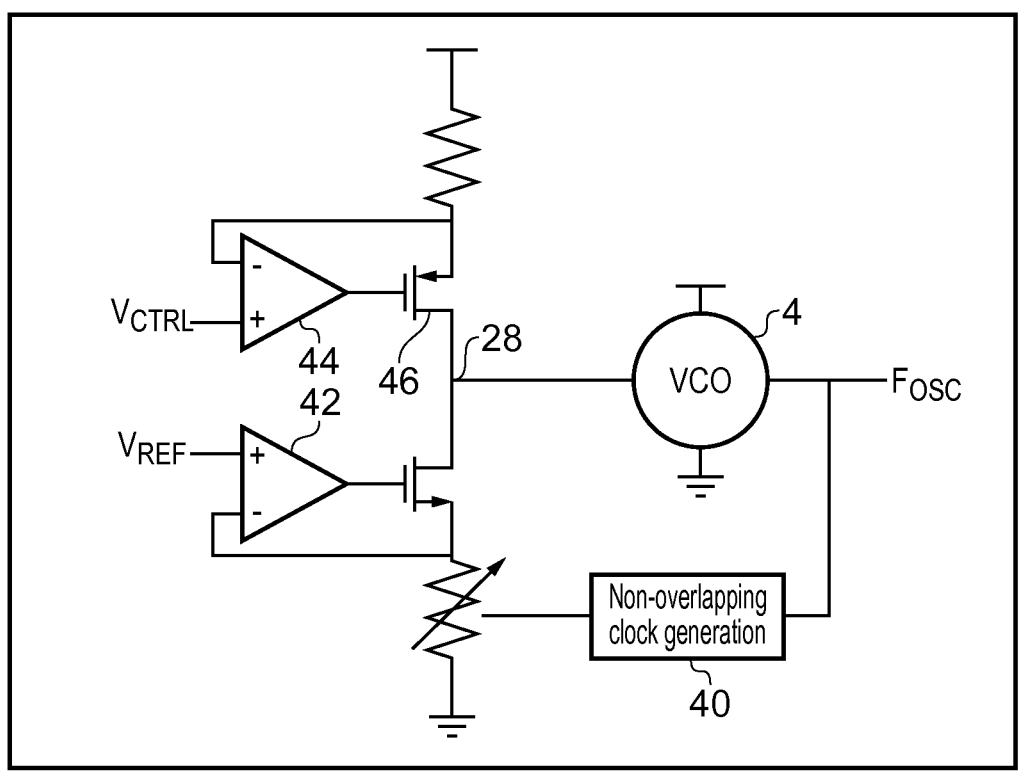
FIG. 5 shows an example arrangement for tuning the frequency at which the oscillator output is regulated.

2. Linear frequency tuning: The frequency is proportional to the reference current in the configuration shown in FIG. 3. An alternative embodiment is shown in FIG. 5 in which an additional regulator 44 is provided to control the reference current based on a control voltage $V_{CTRL}$. In this case, the output of the regulator 44 is supplied to a gate of a pass transistor 46, whose conductance depends on the voltage applied to its gate. Hence, by varying the control voltage $V_{CTRL}$ the conductance of the transistor 46 can be varied so as to provide different amounts of reference current to the first node 28 of the feedback loop. Therefore, in FIG. 5 the frequency $F_{OSC}$ is proportional to the input voltage, $V_{CTRL}$.

3. PVT (process, voltage, temperature) insensitive frequency generation: The frequency of the oscillator is determined by the capacitance/current variation rather than transistor speed. In techniques in which the frequency is regulated by regulating the supply voltage, there will still be deviations in the frequency generated by the oscillator from ideal frequencies, and variation between devices of nominally the same type, due to variation during the manufacturing of the devices causing different transistor speeds. In contrast, in the present technique the feedback loop can compensate for such changes in transistor speed, by adjusting the oscillator control signal generated based on the frequency actually being generated by the oscillator, so that such PVT variations do not cause variation in frequency. This allows the frequency to be more precisely controlled.

4. Friendly to low supply voltage: The oscillator is directly connected to the supply. Therefore, the rail-to-rail voltage is generated at the output of the VCO.

5. Wide range capacitive frequency tuning: Instead of changing the load capacitance at the outputs of the delay cells, the number of switched capacitors may be changed in the regulation loop. Therefore, the on/off ratio of the capacitance is $C \times V_{REF} \times F_{OSC}/I_{leak}$, where $I_{leak}$ is the leakage current of the switch.

Figure 6:
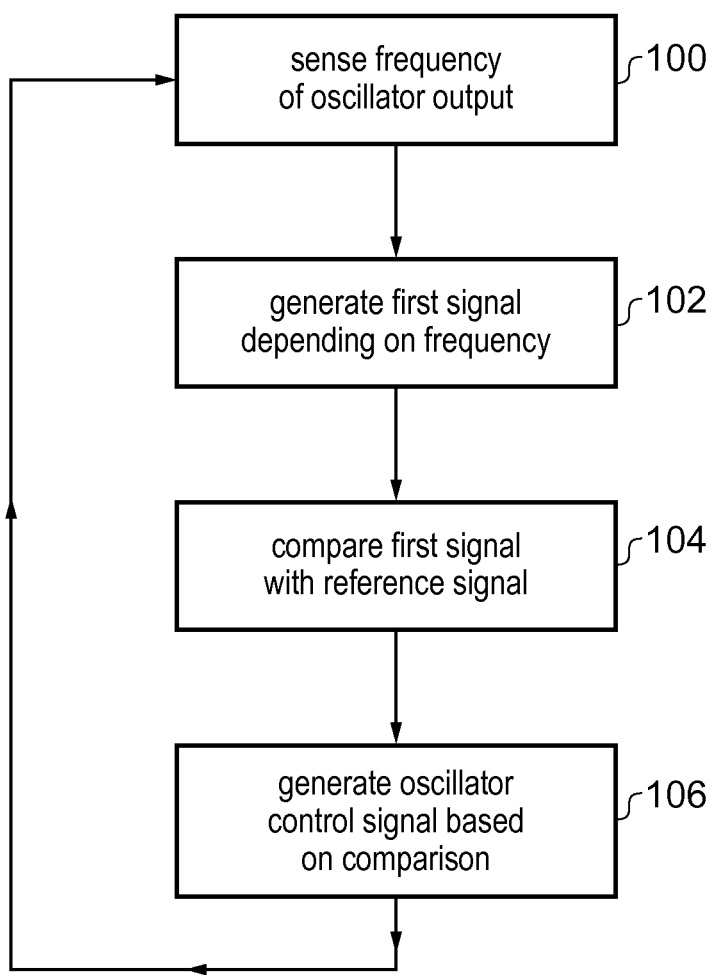
FIG. 6 illustrates a method of regulating a frequency of an output signal of an oscillator.

FIG. 6 shows a method of regulating a frequency of an oscillator. At step 100 the frequency sensing circuitry 22 senses the frequency of the output signal of the oscillator 4.

The frequency sensing circuitry 22 generates a first signal depending on the sensed frequency at step 102. At step 104 the first signal is compared with a reference signal by the comparison circuit 28. At step 106 the oscillator control signal 14 is generated based on the result of the comparison. This may be an analogue or digital process. The method returns to step 100 where the loop begins again. The method may be repeated continuously to adjust the frequency generated by the oscillator 4 to counteract deviations of the frequency from the ideal frequency represented by the reference.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Oscillator regulation circuitry comprising:
control circuitry to generate an oscillator control signal for regulating a frequency of an output signal of an oscillator;
a first voltage regulating circuit to regulate an input voltage for providing different amounts of reference current to the oscillator, wherein the first voltage regulating circuit comprises a first operational amplifier and a first transistor arranged in series such that an output of the first operational amplifier is coupled to a gate of the first transistor, and wherein the first transistor is coupled between an inverting input of the operational amplifier and the oscillator;
wherein the control circuitry comprises frequency sensing circuitry to sense the frequency of the output signal of the oscillator and to generate a first signal dependent on the frequency of the output signal, wherein the frequency sensing circuitry comprises at least one switched capacitor;
a second voltage regulating circuit to regulate the input voltage for charging the at least one switched capacitor, wherein the second voltage regulating circuit comprises a second operational amplifier and a second transistor arranged in series such that an output of the second operational amplifier is coupled to a gate of the second transistor, and wherein the second transistor is coupled between the oscillator and an inverting input of the second operational amplifier; and
the control circuitry is to generate the oscillator control signal in dependence on a comparison between the first signal and a non-oscillating reference signal.

2. The oscillator regulation circuitry according to claim 1, wherein the control circuitry is to generate the oscillator control signal in dependence on the output signal of the oscillator to counteract changes in the frequency of the output signal caused by variation in a supply voltage of the oscillator.

3. The oscillator regulation circuitry according to claim 1, wherein the first signal has a voltage dependent on the frequency of the output signal, and the non-oscillating reference signal comprises a reference voltage.

4. The oscillator regulation circuitry according to claim 1, wherein the first signal has a current dependent on the frequency of the output signal, and the non-oscillating reference signal comprises a reference current.

5. The oscillator regulation circuitry according to claim 4, wherein the control circuitry comprises a first node to receive both the non-oscillating reference signal and the first signal with the first signal and the non-oscillating reference signal competing to pull the first node towards opposite signal levels, wherein the oscillator control signal depends on a signal level at the first node.

6. The oscillator regulation circuitry according to claim 1, comprising reference signal providing circuitry to provide the non-oscillating reference signal.

7. The oscillator regulation circuitry according to claim 6, wherein the reference signal providing circuitry is to generate a reference current as the non-oscillating reference signal.

8. The oscillator regulation circuitry according to claim 6, wherein the reference signal providing circuitry is to generate the reference signal in dependence on an input voltage supplied to the reference signal providing circuitry.

9. The oscillator regulation circuitry according to claim 1, wherein the frequency sensing circuitry comprises switch circuitry to control the at least one switched capacitor to be alternately charged and discharged at a rate depending on the frequency of the output signal of the oscillator.

10. The oscillator regulation circuitry according to claim 9, wherein the frequency sensing circuitry comprises non-overlapping clock generating circuitry to generate first and second non-overlapping clock signals based on the output signal of the oscillator; and
the switch circuitry is to control the at least one switched capacitor to be charged in response to the first non-overlapping clock signal and to be discharged in response to the second non-overlapping clock signal.

11. An apparatus comprising:
the oscillator regulation circuitry according to claim 1; and
said oscillator.

12. The apparatus according to claim 11, wherein the oscillator has a supply input to receive a supply voltage from a voltage supply, and a control input to receive the oscillator control signal generated by the oscillator regulation circuitry; and
the oscillator is configured to generate the output signal with a frequency depending on the oscillator control signal received at the control input.

13. The apparatus according to claim 11, wherein the oscillator comprises one of a voltage controlled oscillator and a current controlled oscillator.

14. The apparatus according to claim 11, wherein the oscillator has a supply input for receiving a supply voltage from a voltage supply; and
the supply input of the oscillator is coupled directly to the voltage supply.

15. Oscillator regulation circuitry comprising:
control means for generating an oscillator control signal for regulating a frequency of an output signal of an oscillator;
a first voltage regulating means to regulate an input voltage for providing different amounts of reference current to the oscillator, wherein the first voltage regulating means comprises a first operational amplifier and a first transistor arranged in series such that an output of the first operational amplifier is coupled to a gate of the first transistor, and wherein the first transistor is coupled between an inverting input of the operational amplifier and the oscillator;
wherein the control means comprises frequency sensing means for sensing the frequency of the output signal of the oscillator and for generating a first signal dependent on the frequency of the output signal, wherein the frequency sensing means comprises at least one switched capacitor;
a second voltage regulating means to regulate the input voltage for charging the at least one switched capacitor, wherein the second voltage regulating means comprises a second operational amplifier and a second transistor arranged in series such that an output of the second operational amplifier is coupled to a gate of the second transistor, and wherein the second transistor is coupled between the oscillator and an inverting input of the second operational amplifier; and
the control means is for generating the oscillator control signal in dependence on a comparison between the first signal and a non-oscillating reference signal.

16. A method for regulating a frequency of an output signal generated by an oscillator, the method comprising:
regulating an input voltage for providing different amounts of reference current to the oscillator, wherein the regulating is provided by a first operational amplifier and a first transistor arranged in series such that an output of the first operational amplifier is coupled to a gate of the first transistor, and wherein the first transistor is coupled between an inverting input of the operational amplifier and the oscillator;
sensing the frequency of the output signal of the oscillator;
generating a first signal dependent on the frequency of the output signal using at least one switched capacitor;
regulating the input voltage for charging the at least one switched capacitor, wherein the regulating is provided by a second operational amplifier and a second transistor arranged in series such that an output of the second operational amplifier is coupled to a gate of the second transistor, and wherein the second transistor is coupled between the oscillator and an inverting input of the second operational amplifier
comparing the first signal and a non-oscillating reference signal; and
generating the oscillator control signal in dependence on a comparison between the first signal and the non-oscillating reference signal.

* * * * *